June 13, 1967 E. R. KOLB ET AL 3,325,766

SOCKET PANEL FOR INTEGRATED CIRCUIT MODULES

Filed Sept. 23, 1966 2 Sheets-Sheet 1

INVENTORS
EDWIN R. KOLB,
& GORDON E. VAN CAMPEN
BY
YOUNT, RANEY, FLYNN & TAROLLI

ATTORNEYS

INVENTORS
EDWIN R. KOLB,
& GORDON E. VAN CAMPEN
BY
YOUNT, RANEY, FLYNN & TAROLLI
ATTORNEYS 3,325,766
SOCKET PANEL FOR INTEGRATED CIRCUIT MODULES

Edwin R. Kolb, University Heights, and Gordon E. Van Campen, Broadview Heights, Ohio, assignors to Harris-Intertype Corporation, Cleveland, Ohio, a corporation of Delaware Filed Sept. 23, 1966, Ser. No. 581,617
9 Claims. (Cl. 339—18)

This invention relates to a socket panel for multiple-pronged integrated circuit modules.

Various integrated electronic circuit modules have been designed which provide several electrical functions, such as resistance, capacitance, inductance, rectification, and amplification, to provide a complete electrical sub-circuit in a single unit of small size. These integrated circuit modules are provided with several lead-in connections to their respective portions which provide the different electrical functions. In many such integrated circuit modules, the lead-in connections are permanently connected, such as by soldering or welding, to printed circuit boards or cards. In others, the lead-in connections are provided by metal prongs spaced apart in accordance with a predetermined pattern for reception in complementary socket members which provide terminals to be connected electrically to make up a complete circuit, which usually consists of a plurality of the sub-circuits provided by the integrated circuit modules and additional external circuitry. With the latter arrangement, each integrated circuit module constitutes a plug-in unit which, without the use of special tools, may be readily inserted manually in the circuit and readily removed for replacement by a duplicate module if it becomes defective.

Usually, most of all of such integrated circuit modules in a given installation must have separate electrical connections to ground and to a power supply potential above or below the ground potential. The usual practice heretofore for plug-in integrated modules has been to provide such connections by lead-in wires, each soldered at one end to the respective prong-receiving socket member and at the opposite end to ground or a power supply terminal. However, such lead-in wires, due to their length and their small cross-sectional size, present an electrical impedance which can be excessively high where the integrated circuit module is used for high frequency operation.

An important aspect of the present invention is directed to the provision of a novel socket panel which overcomes these difficulties and disadvantages. In accordance with this aspect of the present invention, an insulation panel is provided which has a plurality of groups of openings, with the openings in each group positioned in accordance with the positions of the prongs on the respective integrated circuit modules, and with respective prong-receiving socket members seated in these openings. On one major face of this panel, there is a broad area electrically-conductive layer to provide a low impedance connection for either the respective power supply lead-in prong or the ground lead-in prong of each integrated circuit module. The opposite major face of the panel has a similar broad area electrically-conductive layer to provide a low impedance connection for the other (i.e., ground or power supply) lead-in prong of each integrated circuit module. The electrically-conductive layers are positioned with respect to the openings in the panel so that in the complete assembly, when socket members are seated in these openings, the respective ground potential and power supply socket members may each be connected to these layers by a low impedance connection, such as a drop of solder or a spot weld.

Another advantage of the present socket panel is that the broad area conductive layer one major face of the panel may be used to improve the dissipation of heat from the integrated circuit modules on that panel, as described more fully hereinafter.

Still another advantage of the present invention is that, in its preferred embodiments, the individual socket members on the panel have terminal posts which are adapted to receive wire-wrap connections. This is advantageous because of the greater speed, ease and reliability with which wire-wrap connections can be made, compared to soldered connections. Also, when wire-wrap connections are provided, the electrical wires which interconnect different socket terminal posts may be shorter than if they were soldered, and they may be positioned in a non-parallel, random or scrambled manner to minimize inductive coupling between them which might detract from the desired operation of the circuit. Also, as compared to soldered wiring, wire-wrapping is an extremely flexible technique which permits the circuitry to be changed readily, if desired.

A principal object of the present invention is to provide a novel and improved socket panel for receiving multiple-pronged integrated circuit modules which enables the modules to be readily plugged in or removed from the panel and enables a relatively large number of such modules to be mounted and interconnected electrically so as to occupy a small space.

Another object of this invention is to provide a novel and improved socket panel for multiple-pronged integrated circuit modules in which the power potential and ground connections for these modules present a negligibly small impedance, particularly for high frequency operation.

Another object of this invention is to provide a novel and improved socket panel for multiple-pronged integrated circuit modules which can be used to improve the dissipation of heat from the modules.

Another object of this invention is to provide a novel and improved socket panel for multiple-pronged integrated circuit modules which is especially adapted for the use of wire-wrap electrical connections to the modules.

Further objects and advantages of this invention will be apparent from the following detailed description of a presently-preferred embodiment thereof which is illustrated in the accompanying drawings.

Figure 1:
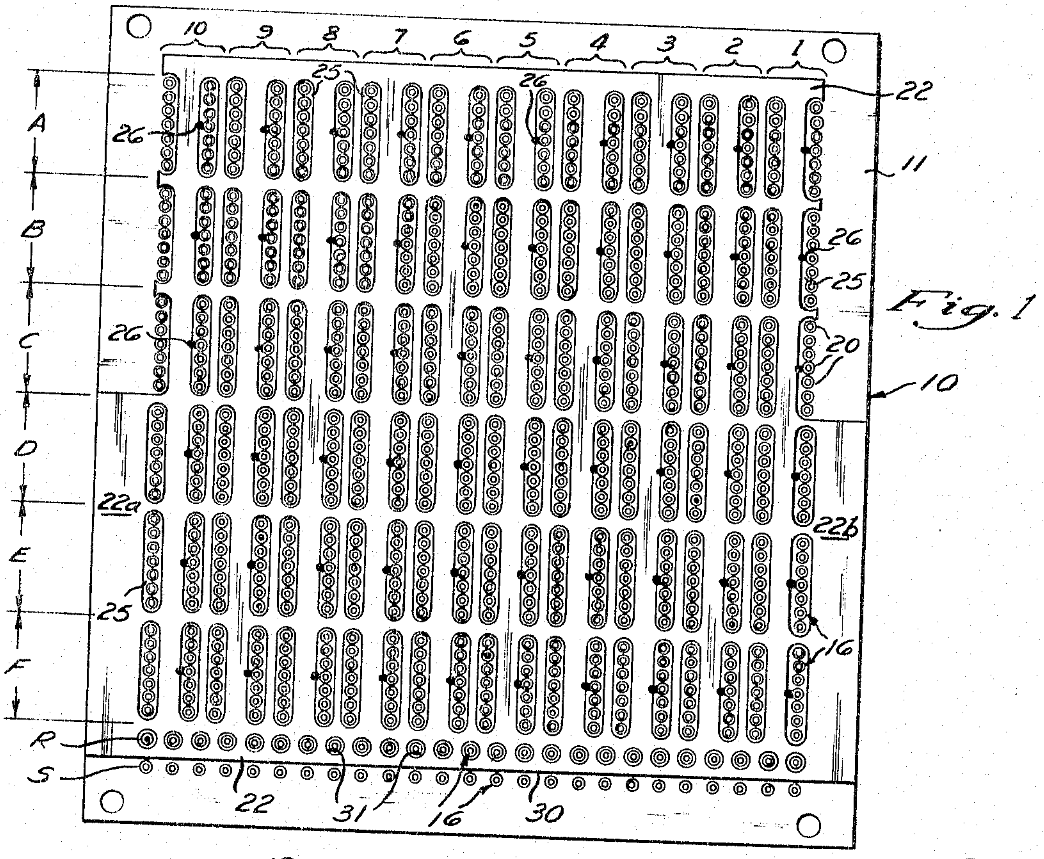
FIGURE 1 is a top plan view of a socket panel in accordance with a first embodiment of the present invention.
Figures 3, 4:
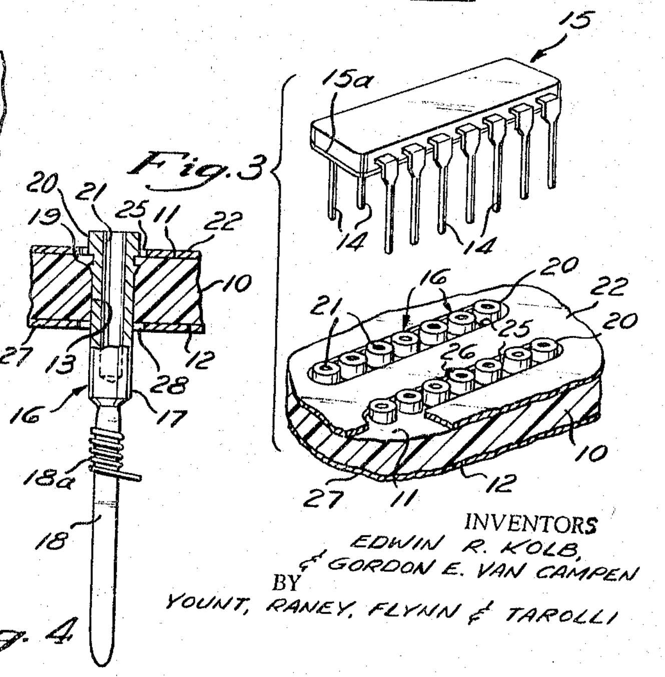
FIGURE 3 is an enlarged fragmentary exploded perspective view showing a group of socket members in the FIG. 1 panel and an integrated circuit module having two rows of lead-in prongs for insertion in these socket members.
FIGURE 4 is a fragmentary section through the FIG. 1 panel, showing one of the socket members partly in section and partly in elevation, with a wire-wrap connection to the terminal post portion of this socket member.

Referring to FIGS. 1 and 4, the present invention comprises a panel 10 of suitable electrical insulation or dielectric material which preferably is rigid. The panel presents flat, opposite major faces 11 and 12 of broad surface area. The panel has a plurality of openings 13 extending through the thickness of the panel between its opposite major faces 11 and 12, as best seen in FIG. 4. These openings are arranged in groups, with each group being composed of several openings positioned to receive individually the respective lead-in prongs 14 of an integrated circuit module 15 (FIG. 3). In this particular embodiment, the integrated circuit module is of a known type which has seven electrically-conductive, metal lead-in prongs at each of its opposite longer sides. However, it is to be understood that the socket panel of the present invention may be designed to accommodate integrated circuit modules of any desired design, simply by positioning the panel openings in accordance with the positions of the module prongs.

The particular socket panel shown in FIG. 1 can accommodate as many as sixty of the integrated circuit modules shown in FIG. 3. Referring to FIG. 1, the socket panel has ten double columns of openings designated 1–10 from right to left in FIG. 1, and each of these double columns is made up of six successive groups designated A through F from top to bottom at the left of FIG. 1. The group of openings 1–A consists of two columns of seven openings each (fourteen in all) and this is true of each of the remaining groups 1–B, 1–C, etc.

In addition, there are two rows of additional openings, R and S, near the lower edge of the socket panel in FIG. 1 to receive additional terminals which are not intended to receive the integrated circuit modules, but instead are intended to interconnect the different integrated circuit modules on this panel or to make connections to circuitry not carried by this particular panel.

A socket and terminal post member is seated in each of the openings 13 in the panel to receive the corresponding prong 14 of an integrated circuit module 15. As best seen in FIG. 4, this socket and terminal post member, designated in its entirety by the reference numeral 16, has a generally tubular socket portion 17 at one end and a terminal post portion 18 at the opposite end. Preferably, the socket portion 17 has a tight fit in the corresponding panel opening 13 and it has an integral annular tooth 19 on its periphery for biting engagement with the material of the panel 10 at the respective opening 13 between the major faces 11 and 12 of the panel to prevent withdrawal of the socket member 16 after it has been driven into the panel. The socket portion 17 at its upper end in FIG. 4 has an enlarged annular flange 20 which abuts against the major face 11 of the panel. The socket portion 17 presents a recess 21 which is open at this flange 20 for the snug reception of a corresponding prong 14 of the integrated circuit module.

The socket portion 17 extends from its flange 20 completely through the thickness of the panel and well beyond the latter's opposite major face 12. The terminal post portion 18 is an integral extension of the socket portion 17 and, in accordance with the preferred embodiment of this invention, it has a square or other polygonal cross-section such that it presents distinct corners at its periphery. This makes possible the use of the known wire-wrap technique for making electrical connections to the terminal post. FIG. 4 shows a wire 18*a* which is wrapped tightly for several turns around the terminal post 18.

The prongs 14 of the integrated circuit modules and the socket members 16 preferably have a gold plating or other oxidation-resistant coating.

In accordance with the present invention, a broad area layer 22 of suitable metal of high electrical conductivity, such as copper, is provided on the major face 11 of the panel 10. This layer 22 is bonded or adhesively secured to the panel in any desired manner. As shown in the embodiment of FIG. 1, the high conductivity layer 22 extends across the panel in close proximity to all of the socket-receiving openings 13 in the panel and has a close spacing from the flanges 20 of the socket members 16 seated in these openings. At the panel openings, the electrically-conductive layer 22 has cut-outs or openings 25, which may be formed by a conventional etching technique. The edges of these openings 25 have close spacings from the flanges 20 of the corresponding socket members 16, as best seen in FIG. 4. These socket flanges 20 are all spaced from one another so that the socket members 16 are electrically separate.

As best seen in FIG. 3, one particular socket member of each double-column group of fourteen (corresponding to the fourteen prongs of the respective integrated circuit module) has a low impedance electrical connection to the electrically-conductive layer 22. Preferably, this low impedance connection is provided by a drop of solder 26 which bridges the small gap between the flange 20 of that particular socket member and the adjacent edge of the layer 22. However, if desired, other techniques, such as spot welding, may be used to provide this low impedance connection, or the electrically-conductive layer 22 may have an integral tab which extends over into abutting, metal-to-metal, edgewise engagement with the flange of this one socket member to provide the low impedance electrical connection between this socket member and the conductive layer 22.

At the lower half of the socket panel in FIG. 1, the electrically-conductive layer 22 extends past the last columns of openings 13 and over to the side edges of the panel to provide broad areas side regions 22*a* and 22*b* to which may be attached broad area lead-in strips or buses (not shown) which provide low resistance lead-in connections to the layer 22.

The entire layer 22, due to its broad area, has an extremely low electrical resistance so that it provides the same electrical potential across its entire extent, regardless of where the electrical connection which establishes this potential is made on layer 22. Therefore, it may be connected to provide either a ground plane or a power plane at a potential above or below ground. The solder or weld connections 26 or, alternatively, the metal-to-metal contact between the equipotential layer 22 and the corresponding socket member of each double-column group have a negligible electrical resistance, and therefore, each of these socket members will be maintained at substantially the same potential as the layer 22.

A further advantage of the broad area layer 22 is that it provides a heat sink for rapidly dissipating heat generated by the integrated circuit module. This heat can travel by conduction through the power supply prong or ground prong of the module to the respective socket member 16 and from there through the low impedance connection at 26 to the layer 22 which, because of its broad area, is able to radiate this heat rapidly to the surrounding atmosphere, or if desired, to conduct the heat to a metal base plate (not shown). In addition, this equipotential layer 22 has a substantially uniform temperature across its entire area so as not to introduce a temperature effect on the respective impedances of the prongs of the different modules which are connected to this layer.

Figure 2:
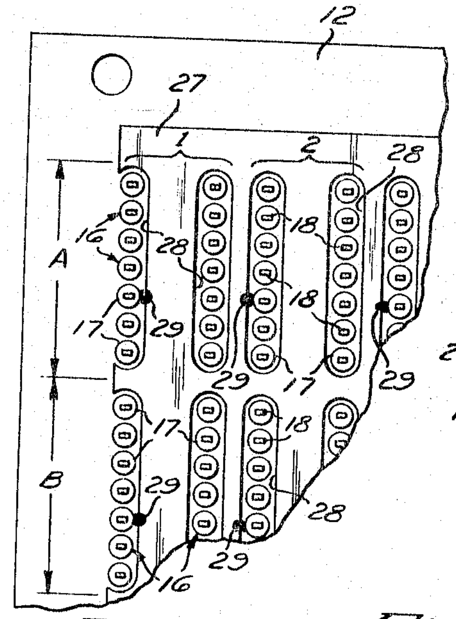
FIGURE 2 is an enlarged fragmentary bottom plan view showing part of the FIG. 1 socket panel.

As best seen in FIG. 2, a substantially identical broad area, equipotential layer 27 of high electrical conductivity metal is provided on the opposite major face 12 of the dielectric panel 10. This layer 27 presents openings or cut-outs 28 which are closely spaced from the panel openings 13 of each group, and the socket portion 17 of a particular socket member 16 of each double-column group is connected to this layer 27 by a low resistance connection 29, such as solder or a spot weld, which bridges the short gap between the socket member and the adjacent edge of layer 27. Alternatively, as described with reference to layer 22, this low impedance connection may be provided by direct metal-to-metal edge contact between this socket member and a tab on the layer 27. Due to these low impedance connections, each of these last-mentioned socket members (which, of course, are not the same socket members as are connected to the layer 22) will be maintained at substantially the same potential as the layer 27. The layer 27 has broad area regions (not shown), which are positioned directly opposite the broad area regions 22*a* and 22*b* of layer 22, for the attachment of electrical lead-in strips or buses. This layer 27 provides a broad area plane which is at substantially a uniform electrical potential and temperature throughout and which also promotes the dissipation of heat from the modules in essentially the same fashion described for the layer 22.

It will be understood that either layer 22 or 27 may be the ground plane and the other the power plane. The socket member 16 of each double-column group which is connected to the ground plane will, of course, correspond to the particular prong 14 of the integrated circuit module which is intended to provide the ground connection for the module, and the same is true for the power supply connection. These positions of ground and power supply prongs on any particular integrated circuit module are, of course, standardized for that particular type of module.

The lower edge 30 of the electrically-conductive layer 22 in FIG. 1 is closely spaced from the socket members 16 in the lowermost row S of panel openings. At the next row of openings (R) above, the layer 22 has openings 31 whose edges are closely spaced from the respective socket members 16 in these openings. The electrically-conductive layer 27 on the opposite major face 12 of the panel has a similar arrangement with respect to the socket members 16 in these two rows of panel openings, R and S. Any of these socket members which are to operate at the same electrical potential as layer 22 or 27 may be connected to the layer by a solder, spot weld, or other low impedance connection.

Figure 5:
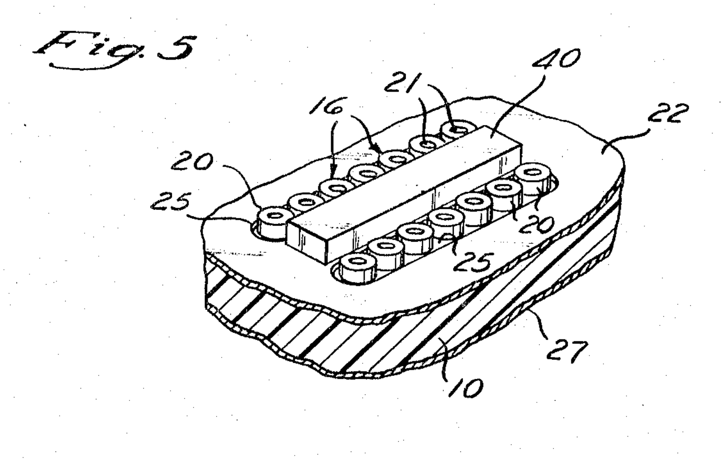
FIGURE 5 is a fragmentary perspective view of a socket panel in accordance with a second embodiment of the present invention.
Figure 6:
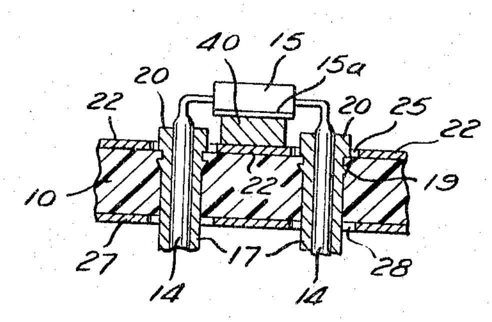
FIGURE 6 is a cross-section through the FIG. 5 socket panel, with an integrated circuit module inserted into the panel.

FIGURES 5 and 6 show a second embodiment of the present socket panel which provides even better dissipation of the heat generated by the integrated circuit modules. These modules are of the same type as shown in FIG. 3. The module 15 itself, which is of known construction, has a metal layer 15*a* on the bottom which is arranged in heat transfer relationship to the different circuit portions in the module.

In accordance with this embodiment of the present invention, the socket panel 10 is identical to that of FIGS. 1–3, except that between each pair of rows of socket members, the layer 22 presents an upstanding, raised metal rib 40 of high thermal conductivity. This rib 40 is positioned to be engaged by the metal layer 15*a* on the bottom of the integrated circuit module 15 when the latter's prongs 14 are inserted into these two rows of socket members. As shown in FIG. 5, preferably this upstanding rib 40 extends along the entire length of these two rows of socket members for direct metal-to-metal engagement by the metal layer 15*a* on the respective integrated circuit module. This rib 40 provides a low thermal resistance path between the metal layer 15*a* on the integrated circuit module and the broad area metal layer 22 on the socket panel, so as to conduct heat rapidly and efficiently from the module to layer 22, which will dissipate it rapidly to the surrounding atmosphere.

Figure 7:
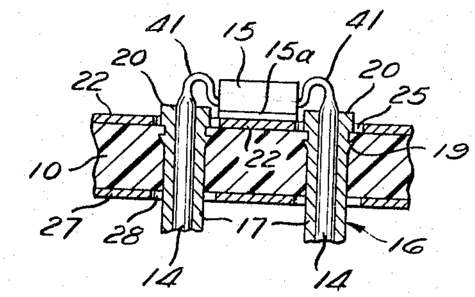
FIGURE 7 is a view similar to FIG. 6 showing the socket panel of FIGS. 1–4, receiving an integrated circuit module which differs from that of FIG. 3 for improved heat dissipation.

FIGURE 7 shows a socket panel identical to that of FIGS. 1–4 and receiving an integrated circuit module 15 of slightly different construction from that of FIG. 3. In FIG. 7, the upper ends of the prongs 14 are connected to the module 15 by reversely bent segments 41 which enable the metal layer 15*a* on the bottom of the module 15 to have direct contact with the portions of the metal layer 22 on the socket panel which are between the two columns of socket members when the module is mounted on the socket panel, as shown in FIG. 7. These portions of layer 22 are substantially co-planar with the rest of this layer. This metal-to-metal contact between the bottom layer 15*a* on the module and the layer 22 on the socket panel enhances the heat transfer from the module to layer 22, which is then able to dissipate it to the atmosphere.

In either the embodiment of FIGS. 5 and 6 or the embodiment of FIG. 7, the thermally-conductive connection between the modules and the metal layer 22 on the panel may be made either to the metal layer which is at ground potential or to the metal layer which is at the power potential above or below ground.

From the foregoing description it will be evident that the present socket panel provides power potential and ground connections for the integrated circuit modules which are of such low impedance as not to detract from the high-frequency performance characteristics of these modules. In addition, either of the broad area metal layers on the panel may be used to promote the dissipation of heat from the integrated circuit modules, as described. Also, preferably the socket members in the present panel have terminal posts which are adapted to receive wire-wrap connections, which are especially advantageous for high density packaging of electronic circuitry, as already explained.

While certain presently-preferred embodiments of this invention have been described in detail with reference to the accompanying drawings, it is to be understood that various modifications, omissions and adaptations which depart from the disclosed embodiments may be adopted without departing from the spirit and scope of the present invention, as defined in the appended claims.

Having described our invention, we claim:

1. A socket panel for a plurality of multiple-pronged integrated circuit modules comprising:

an electrical insulation panel having opposite major faces and having a plurality of groups of openings extending through the panel between said major faces and positioned to receive the prongs of respective integrated circuit modules;

a plurality of similar groups of socket members seated respectively in said openings in the panel, each of said socket members presenting a prong-receiving recess which is open at one of said major faces of the panel and a projecting terminal post at the opposite major face of the panel;

broad area electrically-conductive layers on the respective opposite major faces of said panel;

a first one of the socket members in each group thereof being connected conductively to the electrically-conductive layer on one of said major faces of the panel to provide a power potential connection for the integrated circuit module connected to that group of socket members;

and a second one of the socket members in each group thereof being connected conductively to the electrically-conductive layer on the opposite major face of the panel to provide a ground connection for the respective integrated circuit module;

said electrically-conductive layers being spaced from and electrically separate from, said socket members except at said power potential and ground connection.

2. A socket panel according to claim 12, wherein each of said electrically-conductive layers on the panel is closely spaced from said groups of openings and said socket members.

3. A socket panel according to claim 13, wherein said first and second socket members are soldered respectively to said electrically-conductive layers.

4. A socket panel according to claim 13, wherein said first and second socket members are welded to the respective electrically-conductive layers.

5. A socket panel according to claim 12, wherein said terminal posts on the socket members have distinct corners for engagement by wrapped wires to provide electrical connections to the respective prongs of the corresponding integrated circuit modules.

6. A socket panel according to claim 12, wherein said layers present broad area regions for the attachment of electrical lead-in members to the respective layers.

7. A socket panel for a plurality of multiple-pronged integrated circuit modules, each having lead-in prongs at opposite sides and a metal layer on the bottom between said prongs, said socket panel comprising:

an electrical insulation panel having opposite major faces and having a plurality of groups of openings, each group of openings being arranged in two columns and positioned to receive the lead-in prongs of a respective integrated circuit module, each opening extending through the panel between said major faces;

a plurality of groups of socket members seated respectively in said openings in the panel, each of said socket members presenting a prong-receiving recess which is open at one of said major faces of the panel and a terminal post portion projecting beyond the opposite major face of the panel and having distinct corners for receiving wire-wrap electrical connections;

broad area electrically-conductive layers on the respective opposite major faces of said panel;

a first one of the socket members in each group thereof being connected conductively to the electrically-conductive layer on one of said major faces of the panel to provide a power potential connection for the integrated circuit module connected to that group of socket members;

a second one of the socket members in each group thereof being connected conductively to the electrically-conductive layer on the opposite major face of the panel to provide a ground connection for the respective integrated circuit module;

said electrically-conductive layer on the face of the panel at which said prong-receiving recesses are open being of high heat conductivity material and having portions thereof between the two columns of the panel openings of each group positioned for engagement by said metal layer on the bottom of the respective module to conduct heat away from the latter;

said electrically-conductive layers being spaced from, and electrically separate from, said socket members except at said power potential and ground connections.

8. A socket panel according to claim 20, wherein said last-mentioned portions are substantially co-planar with the rest of said last-mentioned layer.

9. A socket panel according to claim 20, wherein said last-mentioned portions are raised ribs on said last-mentioned layer.

References Cited

UNITED STATES PATENTS

| | | | |
|---|---|---|---|
| 2,006,436 | 7/1935 | Bowers | 339—18 |
| 2,586,854 | 2/1952 | Myers | 339—17 X |
| 3,042,740 | 7/1962 | Bosworth | 174—68.5 |
| 3,061,760 | 10/1962 | Ezzo | 317—100 |
| 3,157,828 | 11/1964 | Flaherty | 317—100 |
| 3,208,028 | 9/1965 | Mittler et al. | 339—18 |
| 3,267,333 | 8/1966 | Schultz | 317—100 |
| 3,274,328 | 9/1966 | Davis | 174—68.5 |

MARVIN A. CHAMPION, *Primary Examiner.*

PATRICK A. CLIFFORD, *Examiner.*